(12) United States Patent
Liu et al.

(10) Patent No.: US 12,111,554 B2
(45) Date of Patent: Oct. 8, 2024

(54) DISPLAY SUBSTRATE AND DISPLAY PANEL

(71) Applicants: Ordos Yuansheng Optoelectronics Co., Ltd., Inner Mongolia (CN); BOE Technology Group Co., Ltd., Beijing (CN)

(72) Inventors: Hong Liu, Beijing (CN); Jingyi Xu, Beijing (CN); Xiaochun Xu, Beijing (CN); Jiantao Liu, Beijing (CN); Wanzhi Chen, Beijing (CN); Chengfu Xu, Beijing (CN); Bo Li, Beijing (CN); Yongqiang Zhang, Beijing (CN); Peng Liu, Beijing (CN); Ruirui Hao, Beijing (CN); Yu Feng, Beijing (CN); Xinguo Wu, Beijing (CN)

(73) Assignees: ORDOS YUANSHENG OPTOELECTRONICS CO., LTD., Inner Mongolia (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/791,338

(22) PCT Filed: Aug. 18, 2021

(86) PCT No.: PCT/CN2021/113203
§ 371 (c)(1),
(2) Date: Jul. 7, 2022

(87) PCT Pub. No.: WO2022/068450
PCT Pub. Date: Apr. 7, 2022

(65) Prior Publication Data
US 2023/0350255 A1   Nov. 2, 2023

(30) Foreign Application Priority Data
Sep. 30, 2020 (CN) .......................... 202011060839.6

(51) Int. Cl.
G02F 1/1368 (2006.01)
H10K 59/124 (2023.01)

(52) U.S. Cl.
CPC .......... *G02F 1/1368* (2013.01); *H10K 59/124* (2023.02)

(58) Field of Classification Search
CPC ........................... G02F 1/1368; H10K 59/124
See application file for complete search history.

(56) References Cited

U.S. PATENT DOCUMENTS

2019/0036073 A1    1/2019  Yu et al.
2020/0395574 A1*  12/2020  Lee .................. H10K 59/00
(Continued)

FOREIGN PATENT DOCUMENTS

CN    101937895 A    1/2011
CN    106601776 A    4/2017
(Continued)

OTHER PUBLICATIONS

Second Office Action issued on Apr. 12, 2023 for application No. CN202011060839.6 with English translation attached.
(Continued)

*Primary Examiner* — Mariam Qureshi
(74) *Attorney, Agent, or Firm* — Nath, Goldberg & Meyer; Joshua B. Goldberg

(57) ABSTRACT

The present disclosure provides a display substrate and a display panel, and belongs to the field of display technology. The present display substrate includes a display region and a peripheral region surrounding the display region; the display substrate includes: a base substrate; a plurality of insulating layers sequentially arranged along a direction away from the base substrate; wherein each of the plurality of insulating layers is located in the display region and the peripheral region; one or more protrusion structures
(Continued)

arranged between at least two adjacent ones of the plurality of insulating layers and in the peripheral region.

17 Claims, 8 Drawing Sheets

(56) References Cited

U.S. PATENT DOCUMENTS

2020/0411596 A1* 12/2020 Guo .................. G06F 3/0443
2022/0399431 A1* 12/2022 Kim .................. H10K 99/00

FOREIGN PATENT DOCUMENTS

| | | |
|---|---|---|
| CN | 106992263 A | 7/2017 |
| CN | 109449163 A | 3/2019 |
| CN | 208722882 U | 4/2019 |
| CN | 208781851 U | 4/2019 |
| CN | 110211971 A | 9/2019 |
| CN | 110246984 A | 9/2019 |
| CN | 110518147 A | 11/2019 |
| CN | 111180496 A | 5/2020 |
| CN | 111369896 A | 7/2020 |
| JP | 2012189726 A | 10/2012 |

OTHER PUBLICATIONS

Office Action dated Oct. 31, 2022 issued in corresponding Chinese Application No. 202011060839.6.

\* cited by examiner

DISPLAY SUBSTRATE AND DISPLAY PANEL

This is a National Phase Application filed under 35 U.S.C. 371 as a national stage of PCT/CN2021/113203, filed Aug. 18, 2021, an application claiming the benefit of Chinese Application No. 202011060839.6, filed Sep. 30, 2020, the content of each of which is hereby incorporated by reference in its entirety.

TECHNICAL FIELD

The present disclosure relates to the field of display technology, and in particular to a display substrate and a display panel.

BACKGROUND

A display panel includes various types of panels, such as a liquid crystal panel, an OLED (organic light-emitting diode) panel, a QLED (quantum dot light-emitting diode) panel, and the like. As an example, a liquid crystal panel generally includes a color filter substrate (CF substrate), a thin film transistor array substrate (TFT array substrate), and a liquid crystal layer disposed therebetween. The inventor has found that in a test for a structural reliability and separation strength of the display panel, a crack easily occurs between insulating layers in a peripheral region of the array substrate of the display panel.

SUMMARY

The present disclosure intends to solve at least one of the problems in the prior art, and provides a display substrate and a display panel.

In a first aspect, an embodiment of the present disclosure provides a display substrate, including a display region and a peripheral region surrounding the display region; wherein the display substrate includes:
  a base substrate;
  a plurality of insulating layers sequentially arranged along a direction away from the base substrate; wherein each of the plurality of insulating layers is located in the display region and the peripheral region; and
  one or more protrusion structures arranged between at least two adjacent ones of the plurality of insulating layers and in the peripheral region.

Each protrusion structure includes a groove on a sidewall of the protrusion structure and around a circumference direction of the protrusion structure.

The plurality of insulating layers includes an interlayer insulating layer and a planarization layer sequentially arranged along the direction away from the base substrate; and the one or more protrusion structures are between the interlayer insulating layer and the planarization layer.

The display substrate further includes a thin film transistor on the base substrate and in the display region;
  wherein the interlayer insulating layer is on a side, close to the base substrate, of a layer where a source electrode and a drain electrode of the thin film transistor are located; and the one or more protrusion structures and the source electrode and the drain electrode of the thin film transistor are arranged in a same layer.

Each protrusion structure includes a first sub-structure, a second sub-structure, and a third sub-structure stacked along the direction away from the base substrate; each of the source electrode and the drain electrode of the thin film transistor includes a first metal layer, a second metal layer and a third metal layer stacked along the direction away from the base substrate:
  the first sub-structure and the first metal layer are arranged in a same layer and are made of a same material;
  the second sub-structure and the second metal layer are arranged in a same layer and are made of a same material; and
  the third sub-structure and the third metal layer are arranged in a same layer and are made of a same material.

When each protrusion structure includes a groove on a sidewall of the protrusion structure and around a circumference direction of the protrusion structure, an outer boundary of an orthographic projection of the second sub-structure on the base substrate is inside outer boundaries of orthographic projections of the first sub-structure and the third sub-structure on the base substrate, so as to form the groove on the sidewall of the protrusion structure.

An included angle is in a range of 55° to 75° between a surface of the third sub-structure close to the base substrate and a tangent of a surface where an outer boundary of the second sub-structure is located.

Each of the first metal layer, the second metal layer and the third metal layer is made of at least one of titanium, molybdenum, aluminum and copper or a combination thereof.

The one or more protrusion structures are at corners of the peripheral region.

The one or more protrusion structures surround the display region.

The one or more protrusion structures include at least one protrusion structure, which is continuously arranged.

The one or more protrusion structures include a plurality of protrusion structures, which are arranged at intervals.

An orthographic projection of each protrusion structure on the base substrate is square or rectangular.

In a second aspect, an embodiment of the present disclosure provides a display panel, which includes the display substrate.

The display panel includes any one of a liquid crystal panel, an OLED panel, and a QLED panel.

DETAIL DESCRIPTION OF EMBODIMENTS

In order to enable one of ordinary skill in the art to better understand the technical solutions of the present disclosure, the present disclosure will be described in further detail with reference to the accompanying drawings and the detailed description.

Unless defined otherwise, technical or scientific terms used herein shall have the ordinary meaning as understood by one of ordinary skill in the art to which the present disclosure belongs. The terms "first", "second", and the like used in the present disclosure are not intended to indicate any order, quantity, or importance, but rather are used for distinguishing one element from another. Further, the term "a", "an", "the", or the like used herein does not denote a limitation of quantity, but rather denotes the presence of at least one element. The term of "comprising", "including", or the like, means that the element or item preceding the term contains the element or item listed after the term and its equivalent, but does not exclude other elements or items. The term "connected", "coupled", or the like is not limited to physical or mechanical connections, but may include electrical connections, whether direct or indirect connections. The terms "upper", "lower". "left", "right", and the like are used only for indicating relative positional relationships, and when the absolute position of an object being described is changed, the relative positional relationships may also be changed accordingly.

Figure 1:
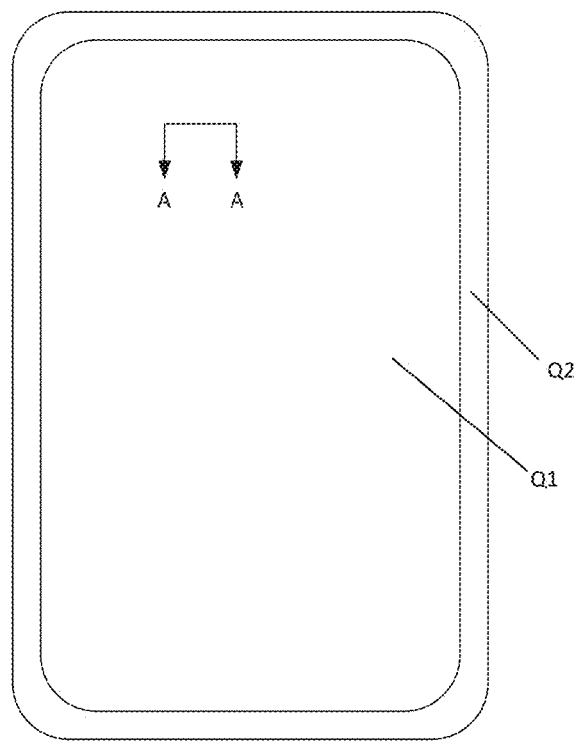
FIG. 1 is a schematic diagram of a structure of a display substrate.

FIG. 1 is a schematic diagram of a structure of a display substrate. As shown in FIG. 1, the display substrate includes a display region Q1 and a peripheral region Q2 surrounding the display region Q1; the display substrate includes a base substrate, a plurality of insulating layers, driving elements (such as a thin film transistor and a storage capacitor) and the like arranged on the base substrate. As an example, the display substrate is an array substrate applied to a liquid crystal panel. When the array substrate and a color filter substrate are aligned and assembled to form a display panel, a sealant is necessarily formed in the peripheral region Q2 of the array substrate and the color filter substrate, to seal the liquid crystal panel.

It should be noted that in the embodiments of the present disclosure, the display substrate may be applied not only to the liquid crystal panel, but also to the OLED panel or the QLED panel, and to other types of display panels. In the embodiments of the present disclosure, as an example, the display substrate is applied to the liquid crystal panel, for ease of understanding.

Figure 2:
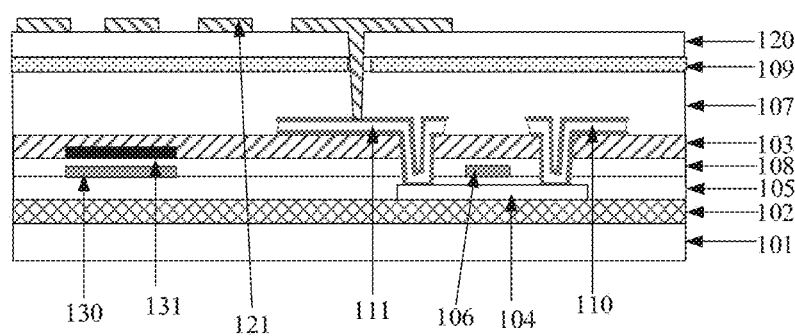
FIG. 2 is a cross-sectional view taken along A-A in FIG. 1.

FIG. 2 is a cross-sectional view taken along A-A in FIG. 1. A thin film transistor is a top gate type thin film transistor and includes an active layer 104, a gate electrode 106, a source electrode 110, and a drain electrode 111; the insulating layers include a buffer layer 102, a first gate insulating layer 105, an interlayer insulating layer 103, and a planarization layer 107. Specifically, the buffer layer 102 is formed on the base substrate 101; the active layer 104 may be formed on the buffer layer 102; the first gate insulating layer 105 covers the buffer layer 102 and the active layer 104; the gate electrode 106 is formed on a side of the first gate insulating layer 105 away from the active layer 104; a second gate insulating layer 108 covers the gate electrode 106 and the first gate insulating layer 105; the interlayer insulating layer 103 covers the second gate insulating layer 108; the source electrode 110 and the drain electrode 111 are formed on a side of the interlayer insulating layer 103 away from the base substrate 101 and respectively located on two opposite sides of the gate electrode 106; and the source electrode 110 and the drain electrode 111 may respectively contact two opposite sides of the active layer 104 through vias (e.g., metal vias). The planarization layer 107 may cover the source electrode 110 and the drain electrode and 111 and the interlayer insulating layer 103. A pixel electrode 121 may be formed on the planarization layer 107 and connected to the drain electrode 111 through a via (e.g., a metal via) extending through the planarization layer 107. It should be understood that the thin film transistor may also be of a bottom gate type. A common electrode 109 may be further disposed on the array substrate, for example, on the planarization layer 107; a passivation layer 120 covers a layer where the common electrode 109 is located; the pixel electrode 121 is formed on the passivation layer 120, and the pixel electrode 121 is connected to the drain electrode 111 through a via extending through the planarization layer 107 and the passivation layer 120. The storage capacitor in FIG. 2 may include a first plate 130 and a second plate 131; the first plate 130 is disposed in the same layer as the gate electrode 106; and the second plate 131 is disposed between the second gate insulating layer 105 and the interlayer insulating layer 103 and opposite to the first plate 130.

For example, the gate electrode 106 and the first plate 130 and the second plate 131 may be made of a metal material or an alloy material, such as molybdenum, aluminum, titanium, or the like. The source electrode 110 and the drain electrode 111 may be made of a metal material or an alloy material, such as a metal single layer or a multi-layer structure formed of molybdenum, aluminum, titanium, and the like. For example, the multi-layer structure is a multi-layer metal stack, such as a three-layer metal stack formed of titanium, aluminum, titanium (Al/Ti/Al), or the like.

The inventor has found that during the process that the array substrate and the color filter substrate are aligned and assembled to form the display panel, two adjacent ones of the insulating layers located in the peripheral region Q2 easily fall off with respect to each other (are separated from each other) in a drawing test. Particularly, the planarization layer and the interlayer insulating layer are easily separated from each other at corners of the display panel in the drawing test, thereby adversely affecting the quality of the display panel.

In view of the above technical problems, the following technical solution is provided in the embodiments of the present disclosure.

Figure 3:
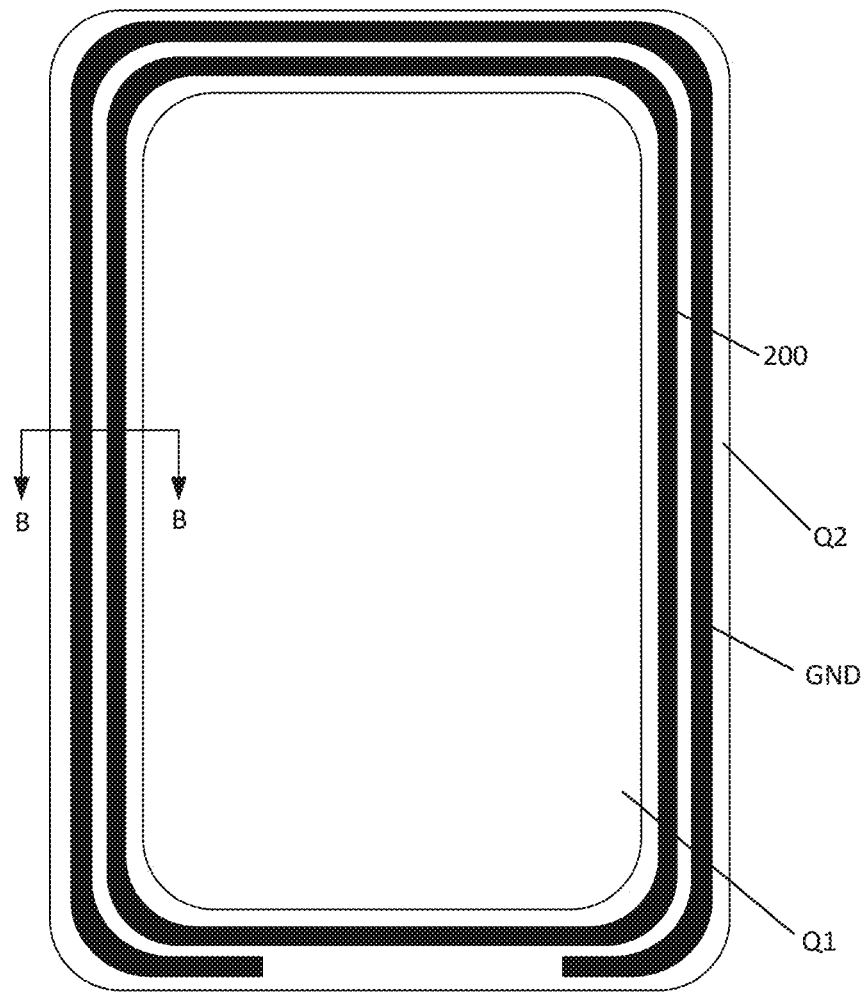
FIG. 3 is a schematic diagram of a display substrate according to an embodiment of the present disclosure.
Figure 4:
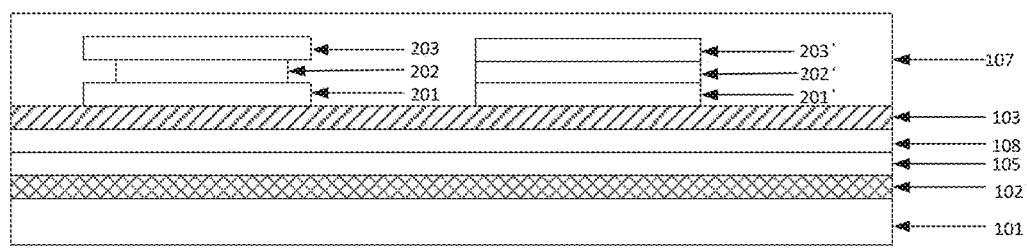
FIG. 4 is a cross-sectional view taken along B-B in FIG. 3.
Figure 5:
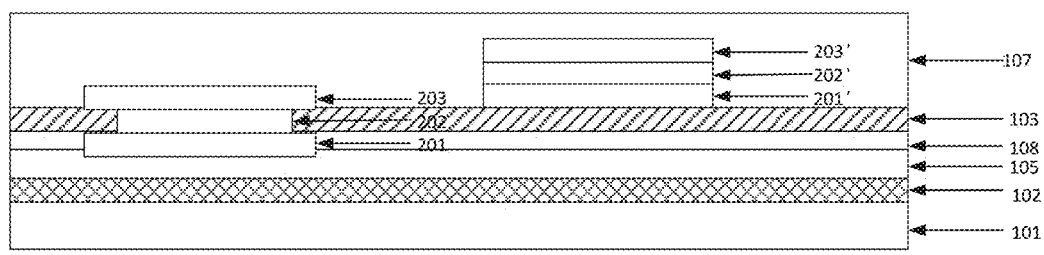
FIG. 5 is another cross-sectional view taken along B-B in FIG. 3.

In a first aspect, FIG. 3 is a schematic diagram of a display substrate according to an embodiment of the present disclosure; FIG. 4 is a cross-sectional view taken along B-B in FIG. 3; FIG. 5 is another cross-sectional view taken along B-B in FIG. 3. As shown in FIGS. 3 to 5, the present disclosure provides a display substrate including the display region Q1 and the peripheral region Q2 surrounding the display region Q1. The display substrate includes the base substrate 101, the plurality of insulating layers and a protrusion structure 200 disposed on the base substrate 101. The plurality of insulating layers are arranged on the base substrate 101 and are sequentially arranged along a direction away from the base substrate 101; each of the plurality of insulating layers is located in the display region Q1 and the peripheral region Q2; the protrusion structure 200 is disposed between at least two adjacent ones of the plurality of insulating layers, and located in the peripheral region Q2.

In the embodiment of the present disclosure, the protrusion structure 200 is added between two adjacent insulating layers in the peripheral region Q2 of the display substrate, so that a contact area between the layers in the peripheral region Q2 may be increased, thereby effectively eliminating the phenomenon of layers falling off caused by insufficient contact between the layers, while preventing moisture from entering the display region Q1, thereby increasing the yield of the display substrate of the embodiment of the present disclosure.

In some embodiments, the insulating layers include the interlayer insulating layer 103 and the planarization layer 107 sequentially disposed along the direction away from the base substrate 101, and the protrusion structure 200 is located between the interlayer insulating layer 103 and the planarization layer 107, thereby effectively eliminating the phenomenon that the interlayer insulating layer 103 and the planarization layer 107 fall off. Alternatively, the protrusion structure 200 may be disposed not only between the interlayer insulating layer 103 and the planarization layer 107, but also between the first gate insulating layer and the second gate insulating layer, or between the planarization layer 107 and the passivation layer 120, or between any two adjacent insulating layers. For ease of understanding, as an example, the protrusion structure 200 is provided between the interlayer insulating layer 103 and the planarization layer 107.

The interlayer insulating layer 103 is made of an inorganic material, such as silicon oxide and silicon nitride or the like, so as to block water and oxygen and prevent alkaline ions; the planarization layer 107 is typically made of an organic material, such as photoresist, acrylic-based polymer and silicon-based polymer.

In some embodiments, in order to further increase a contact area between the layers, a groove is disposed on a sidewall of the protrusion structure 200 and extends along a circumference direction of the protrusion structure 200, so as to avoid the problem of the insulating layers falling off as much as possible.

In some embodiments, as shown in FIG. 2, the interlayer insulating layer 103 is located on a side of a layer, where the source electrode 110 and the drain electrode 111 of the thin film transistor are located, close to the base substrate 101; the protrusion structure 200 is disposed in the same layer as the source electrode 110 and the drain electrode 111 of the thin film transistor. In this case, the protrusion structure 200 and the source electrode 110 and the drain electrode 111 of the thin film transistor may be formed in one patterning process. Such a design can also reduce the number of process steps and use of a mask plate, thereby reducing the cost. In addition, it should be understood that the protrusion structure 200 and the source electrode 110 and the drain electrode 111 of the thin film transistor should be disconnected from each other, to avoid the problem that the protrusion structure 200 is powered on when displaying.

Since the protrusion structure 200 may be disposed in the same layer as the source electrode 110 and the drain electrode 111 of the thin film transistor in the display region Q1, a structure and a material of the protrusion structure 200 may be the same as those of the source electrode 110 and the drain electrode 111. For example, when the source electrode 110 and the drain electrode 111 are of a three-layer metal structure, the protrusion structure 200 may also be of a three-layer metal structure.

It should be noted that the protrusion structure 200 may alternatively be not disposed in the same layer as the source electrode and the drain electrode, which depends on the protrusion structure 200. For example, the protrusion structure 200 may be formed between the first gate insulating layer 105 and the second gate insulating layer 108. In this case, the protrusion structure 200 may alternatively be disposed in the same layer as the gate electrode 106, and a material of the protrusion structure 200 may be the same as that of the gate electrode 106. When the display substrate is a display substrate applied to an OLED panel, the protrusion structure 200 and a metal layer, such as a data line, a power line or the like, may alternatively be disposed in the same layer and be made of the same material.

In one example, as shown in FIG. 4, the protrusion structure 200 may include a first sub-structure 201, a second sub-structure 202, and a third sub-structure 203 sequentially stacked on the interlayer insulating layer 103; three layers of the three-layer metal structure of the source electrode 110 and the drain electrode 111 of the thin film transistor are a first metal layer, a second metal layer and a third metal layer, respectively; at this time, the first sub-structure 201 and the first metal layer are disposed in the same layer and are made of the same material; the second sub-structure 202 and the second metal layer are disposed in the same layer and are made of the same material; the third sub-structure 203 and the third metal layer are disposed in the same layer and are made of the same material.

In one example, as shown in FIG. 5, the protrusion structure 200 includes the first sub-structure 201, the second sub-structure 202, and the third sub-structure 203 sequentially arranged along the direction away from the base substrate 101; while vias extending through the first gate insulating layer 105, the second gate insulating layer 108 and the interlayer insulating layer 103 and connecting the active layer 104 with the source electrode 110 and the drain electrode 111 are formed in the display region Q1, an auxiliary via extending through the first interlayer insulating layer 105, a second interlayer insulating layer 108 and the interlayer insulating layer 103 is also formed in the peripheral region Q2, and the protrusion structure 200 is formed in the auxiliary via, wherein the first sub-structure contacts the first gate insulating layer 105 and the third sub-structure protrudes from the interlayer insulating layer 103. The three layers of the three-layer metal structure of the source electrode 110 and the drain electrode 111 of the thin film transistor are the first metal layer, the second metal layer and the third metal layer, respectively; at this time, the first sub-structure 201 and the first metal layer are disposed in the same layer and are made of the same material; the second sub-structure 202 and the second metal layer are disposed in the same layer and are made of the same material; the third sub-structure 203 and the third metal layer are disposed in the same layer and are made of the same material. In addition, an outer boundary of an orthographic projection of the second sub-structure 202 on the interlayer insulating layer 103 is located inside outer boundaries of orthographic projections of the first sub-structure 201 and the third sub-structure 203 on the interlayer insulating layer, so as to form the groove on the sidewall of the protrusion structure 200, so that a longitudinal section of the protrusion structure 200 is "I"-shaped. It should be noted that for process reasons, the "I"-shaped protrusion structure 200 is irregular.

Figure 6:
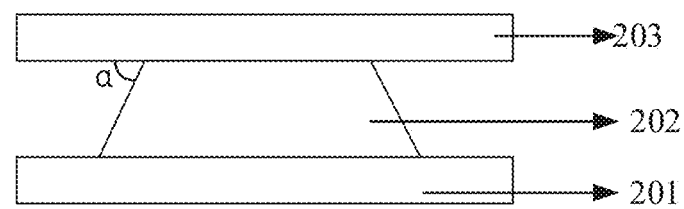
FIG. 6 is a schematic diagram of a protrusion structure in a display substrate according to an embodiment of the present disclosure.
Figure 7:
FIG. 7 is a schematic diagram of a protrusion structure in a display substrate according to an embodiment of the present disclosure.

In some embodiments, there is an included angle between a bottom surface and a sidewall of the groove formed on the sidewall of the protrusion structure 200, which is in a range of about 55° to 75°. That is, as shown in FIG. 6, a surface of the third sub-structure 203 close to the base substrate and a surface, where a tangent of an outer boundary of the second sub-structure 202 is located, form an included angle α therebetween, which is about 55° to 75°. As shown in FIG. 7, when the outer boundary of the second sub-structure 202 is a cambered surface, the surface of the third sub-structure 203 close to the base substrate and the surface, where the tangent of the outer boundary of the second sub-structure 202 is located, form an angle α therebetween, which is about 55° to 75°.

It should be noted that the sidewall of the protrusion structure 200 refers to an outer surface of the protrusion structure, and the circumferential direction of the protrusion structure 200 is a direction surrounding the outer surface of the protrusion structure 200.

In some embodiments, the material of each of the first metal layer, the second metal layer and the third metal layer includes at least one or more of titanium, molybdenum, aluminum and copper.

In one example, the first and third metal layers each may be a titanium layer, i.e., the first metal layer and the third metal layer each may be made of a titanium (Ti) material, and the second metal layer may be an aluminum layer, i.e., the second metal layer may be made of an aluminum (Al) material, so that the first metal layer and the third metal layer may not be affected when a side surface of the second metal layer is etched. However, the first metal layer, the second metal layer, and the third metal layer each may alternatively be made of any other material, such as a metal material (such as molybdenum, aluminum, etc.) or an alloy material, as long as the above technical effects may be achieved, which is not limited by the present disclosure.

In some embodiments, a reference electrode (specifically, a ground electrode GND) is further disposed in the peripheral region Q2 of the display substrate; in the embodiments of the present disclosure, as an example, the reference electrode is the ground electrode GND; the ground electrode GND surrounds the display region Q1 and is located on a side of the protrusion structure away from the display region Q1.

Figure 8:
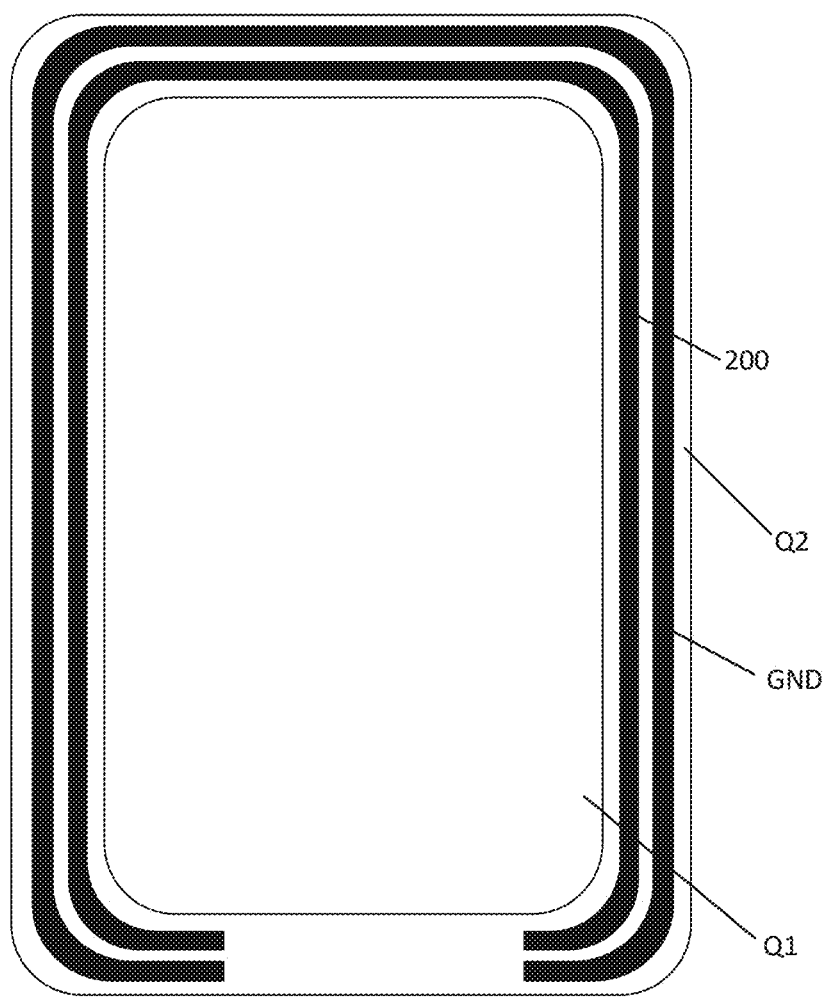
FIG. 8 is a schematic diagram illustrating a distribution of a protrusion structure in a display substrate according to an embodiment of the present disclosure.

In an example, FIG. 8 is a schematic diagram of a distribution of a protrusion structure in a display substrate according to an embodiment of the present disclosure. As shown in FIG. 8, the protrusion structure 200 has a continuous pattern (the protrusion structure 200 is a one-piece structure), which surrounds the display region and is broken at a position on a side of the display region, and the position generally corresponds to a bonding region of the display panel.

In one example, as shown in FIG. 8, the ground electrode GND and the protrusion structure 200 may be disposed in the same layer and be made of the same material. For example, the protrusion structure 200 includes the first sub-structure 201, the second sub-structure 202 and the third sub-structure 203 which are arranged in sequence along the direction away from the base substrate 101; at this time, the ground electrode GND may include a three-layer stack. If the protrusion structure 200 is "I"-shaped, the ground electrode GND may also be "I"-shaped. That is, as shown in FIGS. 4 and 5, the ground electrode GND includes layers 201', 202', 203'. Therefore, the number of the process steps is not increased, and the good connection between two adjacent insulating layers may be well ensured.

Figure 9:
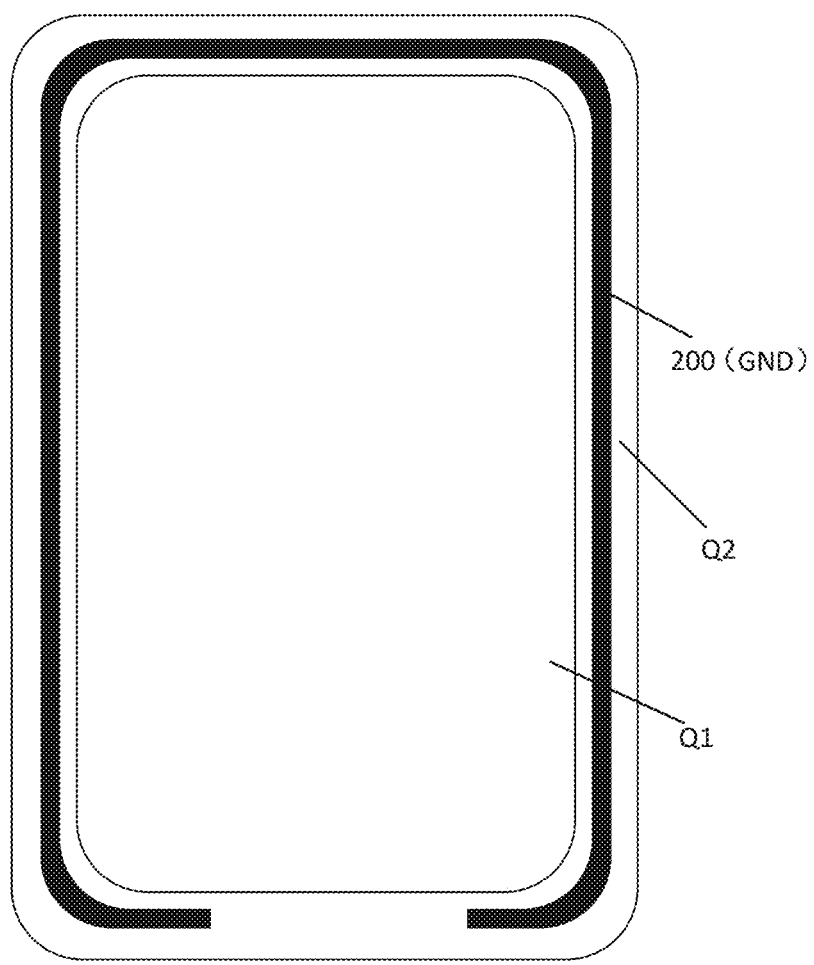
FIG. 9 is a schematic diagram illustrating a distribution of a protrusion structure in a display substrate according to an embodiment of the present disclosure.

In one example, FIG. 9 is a schematic diagram illustrating a distribution of a protrusion structure in a display substrate according to an embodiment of the present disclosure. As shown in FIG. 9, if the protrusion structure 200 is a continuous pattern surrounding the display region Q1, the protrusion structure 200 is used as the ground electrode GND. In this way, only a pattern of an existing ground electrode GND in the related art needs to be changed, so that the good connection between two adjacent insulating layers may be achieved. Meanwhile, an area of the peripheral region Q2 may be reduced, so that a narrow bezel of the display panel may be realized.

In some embodiments, since two adjacent insulating layers are prone to fall off with respect to each other at the corners of the peripheral region Q2 of the display substrate, a plurality of protrusion structures 200 may be disposed only at the corners of the peripheral region Q2. For example, the display panel is a quadrilateral panel, and the plurality of protrusion structures 200 are located at four corners of the display panel. It should be noted that in the embodiment of the present disclosure, as an example, the display panel is a quadrilateral display panel. In a practical application, the display panel is not limited to a quadrilateral display panel, but may be of a polygon such as a hexagon.

Figure 10:
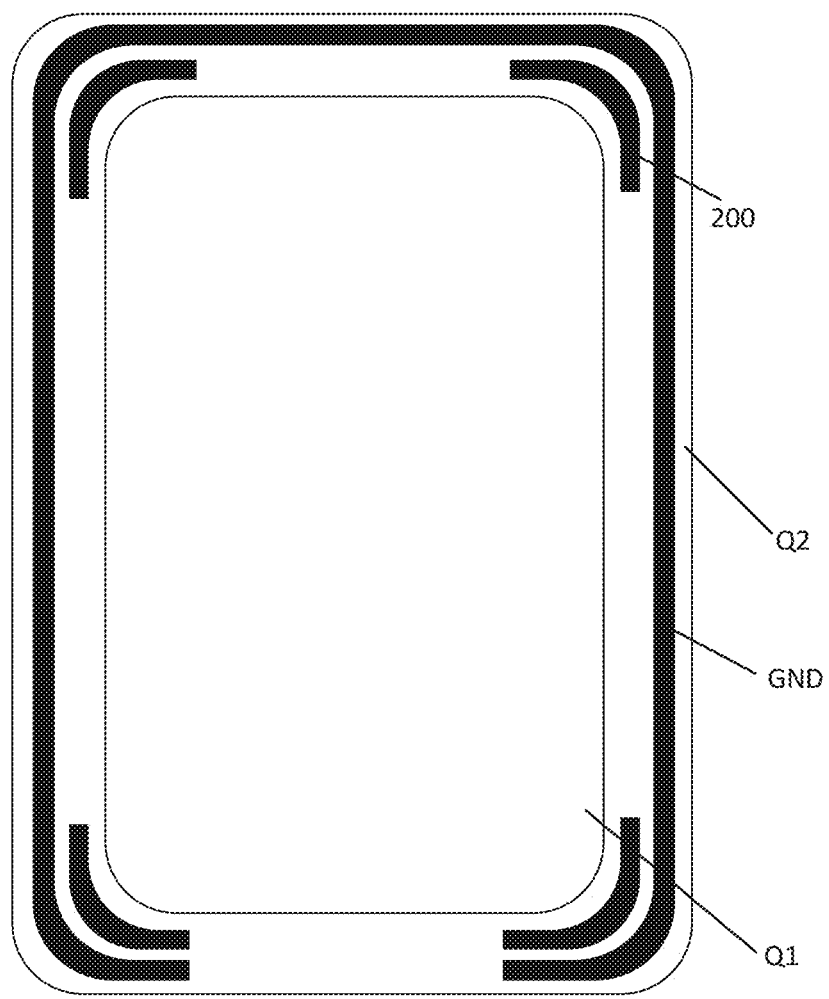
FIG. 10 is a schematic diagram illustrating another distribution of protrusion structures in a display substrate according to an embodiment of the present disclosure.
Figure 11:
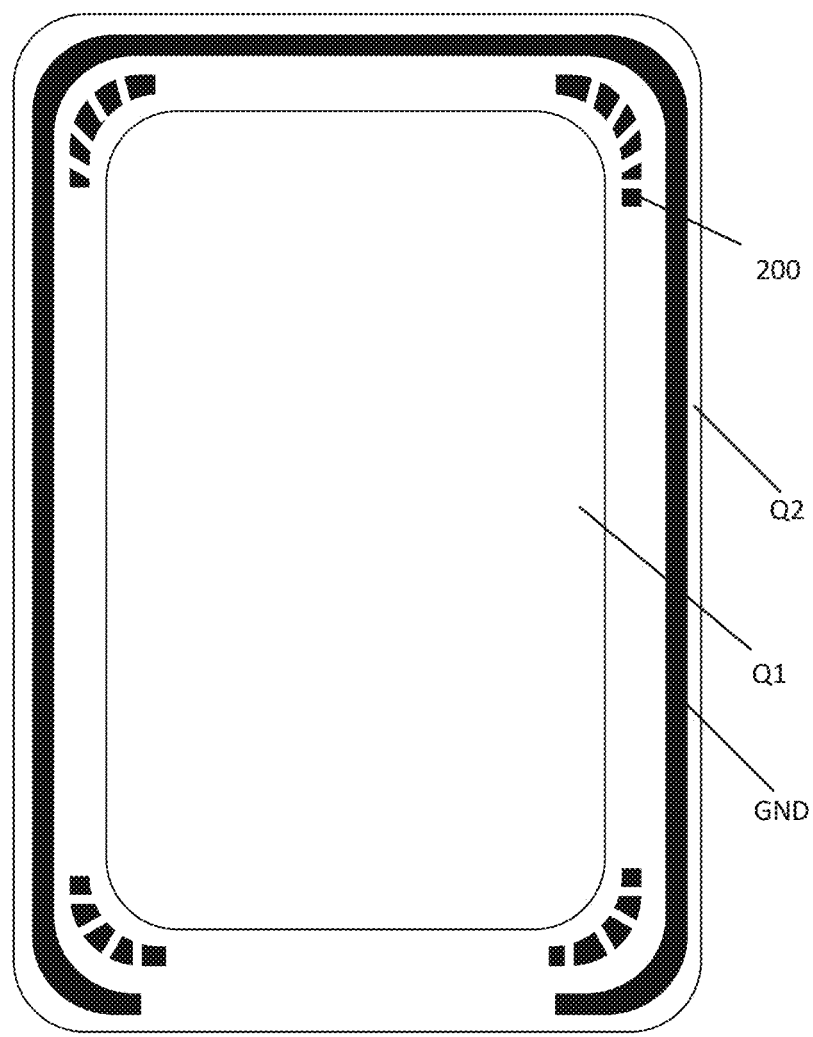
FIG. 11 is a schematic diagram illustrating another distribution of protrusion structures in a display substrate according to an embodiment of the present disclosure.

As shown in FIG. 10, a plurality of protrusion structures 200 are disposed at the corners of the peripheral region Q2, and each corner is provided with only one protrusion structure 200. Such an arrangement of the protrusion structures 200 may not only increase the contact area between the layers, but also prevent moisture from entering the display region Q1 through the corners of the display panel. Alternatively, as shown in FIG. 11, each corner is provided with a plurality of the protrusion structures 200, so as to increase the contact area between the layers as much as possible, so that attachment between two adjacent layers is stronger.

In some embodiments, the protrusion structure 200 is disposed to surround the display region Q1 (the protrusion structure 200 is disposed around the display region Q1), which increases the contact area between the layers and more effectively avoid the problem that two adjacent insulating layers fall off in the peripheral region Q2, compared with the case where the protrusion structures 200 are disposed only at the corners.

Figure 12:
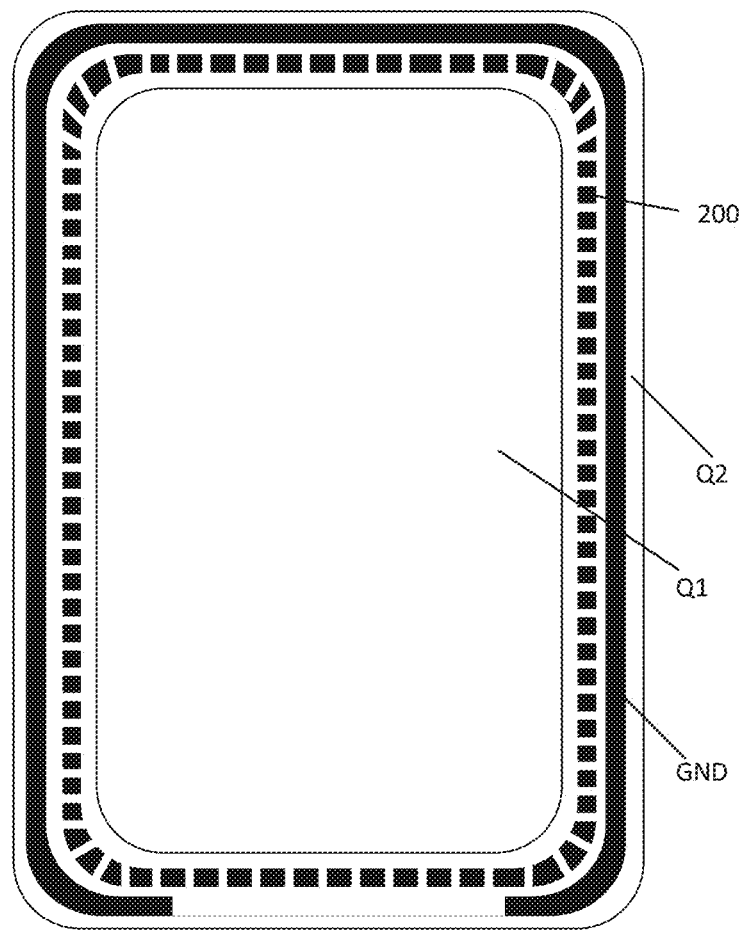
FIG. 12 is a schematic diagram illustrating another distribution of protrusion structures in a display substrate according to an embodiment of the present disclosure.

As shown in FIGS. 3, 8 and 9, the protrusion structure 200 is disposed to surround the display region Q1, and only one protrusion structure 200 is included. Such an arrangement of the protrusion structure 200 not only can increase the contact area between two adjacent layers, but also can prevent moisture from entering the display region Q1 from the corners of the display panel. Alternatively, as shown in FIG. 12, a plurality of protrusion structures 200 are disposed at intervals and surround the display region Q1, so as to increase the contact area between two adjacent layers as much as possible, so that the attachment between the two adjacent layers is stronger.

In some embodiments, when the plurality of protrusion structures 200 are included, an orthographic projection of each protrusion structure 200 on the base substrate 101 is square or rectangular, but may also be a shape with more sides such as a hexagon, which is not listed herein. A method for manufacturing a display substrate according to an embodiment of the present disclosure will be described below by taking an example where the insulating layers include the interlayer insulating layer 103 and the planarization layer 107 and one or more protrusion structures 200 are located between the interlayer insulating layer 103 and the planarization layer 107.

It should be noted that in the embodiment of the present disclosure, a patterning process may include only a photolithography process, or include a photolithography process and an etching step, and may alternatively include other processes for forming a predetermined pattern, such as printing, inkjet printing, or the like; the photolithography process refers to a process for forming a pattern by using a photoresist, a mask plate, an exposure machine and the like, including a film formation, an exposure, a development or the like. The corresponding patterning process may be selected according to the structure formed in the present disclosure.

The thin film transistor formed in the following is located in the display region Q1, and the one or more protrusion structures 200 are located in the peripheral region Q2, which is not repeated in the following.

S1, depositing the buffer layer 102 on the base substrate 101, and forming a pattern including the active layer 104 of the thin film transistor on the buffer layer 102 through a patterning process.

In step S1, an amorphous silicon (a-Si) film is firstly formed on the buffer layer 102 through a deposition process including a plasma enhanced chemical vapor deposition process and a low pressure chemical vapor deposition process.

Then, the amorphous silicon film is crystallized to convert the amorphous silicon film into a polycrystalline silicon film (P-Si) using an excimer laser crystallization process, a metal induced crystallization process, or a solid phase crystallization process. Then, the polycrystalline silicon film (P-Si) is doped (with P-type dopants or N-type dopants) to determine a conductivity type of a channel region of the thin film transistor TFT. The excimer laser crystallization process and the metal induced crystallization process are two processes for low-temperature polycrystalline silicon, and are more common for converting the amorphous silicon into the polycrystalline silicon. However, the process for converting the amorphous silicon into the polycrystalline silicon according to the present disclosure is not limited to the process for low-temperature polycrystalline silicon, as long as the active layer 104 may be converted into a desired polycrystalline silicon film.

Finally, the pattern including the active layer 104 is formed through a patterning process. That is, a layer of photoresist is formed on the polycrystalline silicon film, the photoresist is exposed and developed, and the polycrystalline silicon film is then dry-etched to form the pattern including the active layer 104.

In addition, the buffer layer 102 may be made of a material having a lattice structure similar to that of Si, so as to form an a-Si film (i.e., an amorphous silicon film in the next step) above the buffer layer 102, so that in the subsequent process of forming the first gate insulating layer 105 of the thin film transistor TFT, a dielectric layer in the storage capacitor may be formed by etching away a portion other than an overlapping region of the a-Si film and plates of the storage capacitor, and therefore, the plates of the storage capacitor are not necessarily formed by doping.

S2, forming the first gate insulating layer 105 on the base substrate 101 after the step S1, and forming a pattern including the gate electrode 106 and the first plate 130 of the storage capacitor on the first gate insulating layer 105.

In step S2, firstly, the first gate insulating layer 105 is formed on the active layer 104 by using a plasma enhanced chemical vapor deposition process, a low pressure chemical vapor deposition process, an atmospheric pressure chemical vapor deposition process, an electron cyclotron resonance chemical vapor deposition process, or a sputtering process; then, a gate metal film is formed by using a sputtering process, a thermal evaporation process, a plasma enhanced chemical vapor deposition process, a low pressure chemical vapor deposition process, an atmospheric pressure chemical vapor deposition process, or an electron cyclotron resonance chemical vapor deposition process. Finally, the pattern including the gate electrode 106 is formed through a patterning process.

In this step, the method further includes: doping a portion of the active layer 104 (p-Si) corresponding to the source electrode 110 and the drain electrode 111 by using an ion implantation process, to enhance ohmic contact of the active layer 104 with the source electrode 110 and the drain electrode 111, and to ensure that a good ohmic contact of the P-Si with the source electrode 110 and the drain electrode 111 is formed.

A portion of the active layer 104 (p-Si) corresponding to the gate electrode 106 is unnecessarily doped, because the doping is performed after the pattern of the gate electrode 106 has been etched, and the P-Si of the active layer 104 in a region corresponding to the gate electrode 106 cannot be doped due to the blocking effect of the gate electrode 106. The P-Si in this region acts as a channel, so that the P-Si is unnecessarily doped. The ion implantation process includes an ion implantation process with a mass analyzer, an ion cloud implantation process without a mass analyzer, a plasma implantation process, or a solid diffusion implantation process. That is, in the present embodiment, the active layer 104 with good semiconductor properties is finally formed due to a plurality of processes such as crystallization, doping and ion implantation performed on the low-temperature polycrystalline silicon material.

S3, forming the second gate insulating layer 108 on the base substrate 101 after the step S2, and forming a pattern including the second plate 131 of the storage capacitor on the second gate insulating layer 108.

In step S3, a metal layer may be formed by using the sputtering process, the thermal evaporation process, the plasma enhanced chemical vapor deposition process, the low pressure chemical vapor deposition process, the atmospheric pressure chemical vapor deposition process, or the electron cyclotron resonance chemical vapor deposition process, and the pattern including the second plate 131 of the storage capacitor is formed through a patterning process.

S4, forming the interlayer insulating layer 103 on the base substrate 101 after the step S3, and forming a pattern including the source electrode 110 and the drain electrode 111, and the one or more protrusion structures 200 on the interlayer insulating layer 103.

In step S4, a source-drain metal film may be formed by using a sputtering process, a thermal evaporation process, a plasma enhanced chemical vapor deposition process, a low pressure chemical vapor deposition process, an atmospheric pressure chemical vapor deposition process, or an electron cyclotron resonance chemical vapor deposition process, and a photoresist is coated on the source-drain metal film, and a portion of the photoresist in the peripheral region Q2 and the photoresist in the whole display region Q1 are then removed by using a gray-scale mask plate or a half-exposure mask plate, and the pattern of the source electrode 110 and the drain electrode 111 is formed through an etching process. Next, the photoresist in the display region is removed, and a pattern including the "I"-shaped protrusion structures 200 and the ground electrode GND is formed through the etching process (with an etching solution including $HNO_3$, $H_2SO_4$).

When the source-drain metal layer includes three metal layers of Ti/Al/Ti, thicknesses of the three metal layers along the direction away from the base substrate are 500±15 Å, 5000±250 Å, 300±25 Å, respectively.

In one example, a height of each protrusion structure 200 along the direction away from the base substrate 101 is 5800 Å; the thicknesses of the three layers of Ti/Al/Ti are 500 Å, 5000 Å, 300 Å, respectively; a width of each protrusion structure 200 is 30 μm to 50 μm. In another example, the height of each protrusion structure 200 along the direction away from the base substrate 101 is 7300 Å; the thicknesses of the three layers of Ti/Al/Ti are 500 Å, 6500 Å, 300 Å, respectively; the width of each protrusion structure 200 is 30 μm to 50 μm.

S5, forming the planarization layer 107 on the base substrate 101 after the step S4, and forming a pattern including the common electrode 109 on the planarization layer 107.

In step S5, the planarization layer 107 may be formed by coating (e.g., spin coating); and then, a conductive metal film is deposited by using a sputtering process, a thermal evaporation process, a plasma enhanced chemical vapor deposition process, a low pressure chemical vapor deposition process, an atmospheric pressure chemical vapor deposition process, or an electron cyclotron resonance chemical vapor deposition process. The conductive metal film has high reflectivity and meets certain requirements for metal work function, and is usually made of a double-layer film or three-layer film: ITO (indium tin oxide)/Ag (silver)/ITO (indium tin oxide), or Ag (silver)/ITO (indium tin oxide). Alternatively, ITO may be replaced with IZO (indium zinc oxide), IGZO (indium gallium zinc oxide), or InGaSnO (indium gallium tin oxide) in the above structure. Finally, a pattern including the common electrode 109 is formed through a patterning process.

S6, forming the passivation layer 120 on the base substrate 101 after the step S5, and forming a via extending through the passivation layer 120 and the planarization layer 107 at a position corresponding to the drain electrode 111 of the thin film transistor.

In step S6, in a similar manner of depositing the first gate insulating layer 105, the passivation layer 120 may be deposited by a plasma enhanced chemical vapor deposition process, a low pressure chemical vapor deposition process, an atmospheric pressure chemical vapor deposition process, or an electron cyclotron resonance chemical vapor deposition process. The passivation layer 120 may be a single-layer of silicon oxide or a stack of multiple sub-layers of silicon oxide and silicon nitride. Then, through a fourth patterning process, the pattern including the passivation layer 120 is formed, and the via extending through the passivation layer 120 and the planarization layer 107 is formed in a region corresponding to the drain electrode 111.

S7, forming a pattern including the pixel electrode 121 through a patterning process on the base substrate 101 after the step S6, wherein the pixel electrode 121 is connected to the drain electrode 111 of the thin film transistor through a via extending through the passivation layer 120 and the planarization layer 107.

In step S7, a conductive metal film may be deposited by using a sputtering process, a thermal evaporation method, a plasma enhanced chemical vapor deposition process, a low pressure chemical vapor deposition process, an atmospheric pressure chemical vapor deposition process, or an electron cyclotron resonance chemical vapor deposition process. The conductive metal film has high reflectivity and meets certain requirements for metal work function, and is usually made of a double-layer film or three-layer film: ITO (indium tin oxide)/Ag (silver)/ITO (indium tin oxide), or Ag (silver)/ITO (indium tin oxide). Alternatively, ITO may be replaced with IZO (indium zinc oxide), IGZO (indium gallium zinc oxide), or InGaSnO (indium gallium tin oxide) in the above structure. Finally, the pattern including the pixel electrode 121 is formed through a patterning process.

The preparation of the display substrate in the embodiment of the present disclosure is completed. Alternatively, structures such as an alignment layer may be formed in the display substrate according to the embodiment of the present disclosure, and are not described herein.

In a second aspect, an embodiment of the present disclosure provides a display panel, which may include the above display substrate. The display panel in the embodiment of the present disclosure may specifically be any one of a liquid crystal panel, an OLED panel, and a QLED panel.

Figure 13:
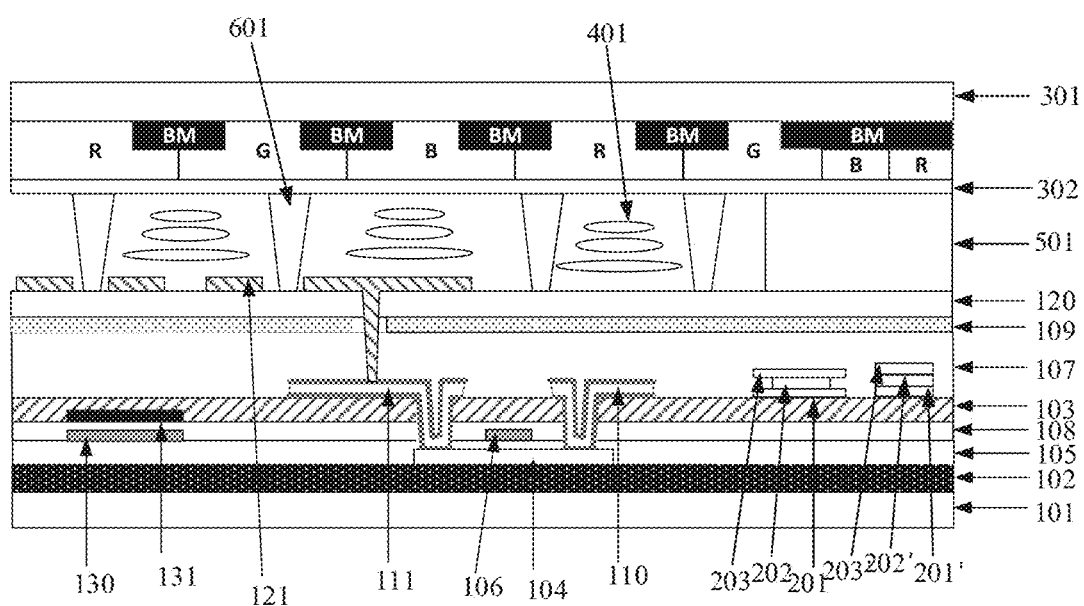
FIG. 13 is a schematic diagram of a structure of a display panel according to an embodiment of the present disclosure.

In some embodiments, FIG. 13 is a schematic diagram of a structure of a display panel according to an embodiment of the present disclosure. As shown in FIG. 13, the display panel may be a liquid crystal panel, which not only includes the display substrate in the above embodiment, but also includes a color filter substrate disposed opposite to the display substrate, a liquid crystal layer 401 disposed therebetween, a spacer 601 for maintaining a cell gap between the display substrate and the color filter substrate, and a sealant 501 for sealing the display substrate and the color filter substrate. In the embodiment of the present disclosure, the color filter substrate includes a base substrate 301, a color filter layer and a dielectric layer 302 sequentially disposed on the base substrate; the color filter layer may include a red color filter R, a green color filter G, a blue color filter B, and a black matrix BM, each of which is disposed between any two adjacent color filters.

It should be noted that in the embodiment of the present disclosure, only one structure of the color filter substrate is given, and actually, color filters in the color filter layer of the color filter substrate are not limited to include a red color filter R, a green color filter G, and a blue color filter B.

In some embodiments, the display panel may be applied in an on-vehicle display screen, but it should be understood that the display panel of the embodiments of the present disclosure is not limited to being applied in the on-vehicle display screen. The display panel may be applied in any product or component with a display function, such as an electronic paper, a mobile phone, a tablet computer, a television, a display, a notebook computer, a digital photo frame, a navigator, etc.

It should be understood that the above embodiments are merely exemplary embodiments adopted to explain the principles of the present disclosure, and the present disclosure is not limited thereto. It will be apparent to one of ordinary skill in the art that various changes and modifications may be made therein without departing from the spirit and scope of the present disclosure, and such changes and modifications also fall within the scope of the present disclosure.

What is claimed is:

1. A display substrate, comprising a display region and a peripheral region surrounding the display region; wherein the display substrate comprises:
   a base substrate;
   a plurality of insulating layers sequentially arranged along a direction away from the base substrate; wherein each of the plurality of insulating layers is located in the display region and the peripheral region; and one or more protrusion structures between at least two adjacent ones of the plurality of insulating layers and in the peripheral region;
wherein each of the one or more protrusion structures comprises a groove on a sidewall of the protrusion structure, recessed into the protrusion structure and extending along a circumference direction of the protrusion structure;
each of the one or more protrusion structures comprises a first sub-structure, a second sub-structure, and a third sub-structure stacked along the direction away from the base substrate; and
an orthographic projection of the second sub-structure on the base substrate is entirely inside an orthographic projection of the first sub-structure on the base substrate and is entirely inside an orthographic projection of the third sub-structure on the base substrate, so as to form the groove on the sidewall of the protrusion structure;
wherein the first sub-structure, the second sub-structure and the third sub-structure each comprise a metal layer;
the plurality of insulating layers comprise a planarization layer, which covers a surface of the third sub-structure away from the base substrate; and
a part of the planarization layer is arranged between a surface of the first sub-structure away from the base substrate and a surface of the third sub-structure close to the base substrate to be in direct contact with a side surface of the second sub-structure along the circumference direction of the protrusion structure.

2. The display substrate of claim 1, wherein the plurality of insulating layers further comprise an interlayer insulating layer, and the interlayer insulating layer and the planarization layer are sequentially arranged along the direction away from the base substrate; and
the one or more protrusion structures are between the interlayer insulating layer and the planarization layer.

3. The display substrate of claim 2, further comprising a thin film transistor on the base substrate and in the display region;
wherein the interlayer insulating layer is on a side, close to the base substrate, of a layer where a source electrode and a drain electrode of the thin film transistor are located; and
the one or more protrusion structures and the source electrode and the drain electrode of the thin film transistor are arranged in a same layer.

4. The display substrate of claim 3, wherein
each of the source electrode and the drain electrode of the thin film transistor comprises a first metal layer, a second metal layer and a third metal layer stacked along the direction away from the base substrate;
the first sub-structure and the first metal layer are arranged in a same layer and are made of a same material;
the second sub-structure and the second metal layer are arranged in a same layer and are made of a same material; and
the third sub-structure and the third metal layer are arranged in a same layer and are made of a same material.

5. The display substrate of claim 2, wherein the planarization layer is in direct contact with a part of the first sub-structure.

6. The display substrate of claim 1, wherein an included angle, between a surface of the third sub-structure close to the base substrate and a tangent of a surface where an outer boundary of the second sub-structure is located, is in a range of 55° to 75°.

7. The display substrate of claim 4, wherein each of the first metal layer, the second metal layer and the third metal layer is made of at least one of titanium, molybdenum, aluminum and copper or a combination thereof.

8. The display substrate of claim 1, wherein the one or more protrusion structures are only provided at corners of the peripheral region.

9. The display substrate of claim 1, wherein the one or more protrusion structures surround the display region.

10. The display panel of claim 9, wherein each of the one or more protrusion structures has a continuous pattern, which surrounds the display region and is broken at a position on a side of the display region.

11. The display substrate of claim 1, wherein the one or more protrusion structures comprise at least one protrusion structure, each of which is continuously arranged.

12. The display substrate of claim 11, wherein the at least one protrusion structure comprises a plurality of protrusion structures which are sequentially arranged in a direction away from the display region, and each of the plurality of protrusion structures has a continuous pattern.

13. The display substrate of claim 1, wherein the one or more protrusion structures comprise a plurality of protrusion structures, which surround the display region and are arranged at intervals along an extension direction of the peripheral region.

14. The display substrate of claim 13, wherein an orthographic projection of each of the plurality of protrusion structures on the base substrate is square or rectangular.

15. A display panel, comprising the display substrate of claim 1.

16. The display panel of claim 15, wherein the display panel comprises any one of a liquid crystal panel, an OLED panel, and a QLED panel.

17. The display substrate of claim 1, wherein the one or more protrusion structures comprise a plurality of protrusion structures, which are only provided at corners of the peripheral region, surround the display region and are arranged at intervals along an extension direction of the peripheral region.

* * * * *